(12) United States Patent
Scholl et al.

(10) Patent No.: US 10,145,883 B2
(45) Date of Patent: Dec. 4, 2018

(54) CIRCUIT ARRANGEMENT FOR DETECTING A TYPE FOR A SOLENOID VALVE

(71) Applicant: Knorr-Bremse Systeme Fuer Nutzfahrzeuge GmbH, Munich (DE)

(72) Inventors: Frank Scholl, Ingersheim (DE); Gerhard Wieder, Besigheim (DE); Dieter Winz, Rottenburg (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 0 days.

(21) Appl. No.: 15/689,762

(22) Filed: Aug. 29, 2017

(65) Prior Publication Data

US 2017/0356948 A1 Dec. 14, 2017

Related U.S. Application Data

(63) Continuation of application No. 14/417,014, filed as application No. PCT/EP2013/065356 on Jul. 19, 2013, now Pat. No. 9,753,074.

(30) Foreign Application Priority Data

Jul. 26, 2012 (DE) .......................... 10 2012 014 800

(51) Int. Cl.
*G01R 31/00* (2006.01)
*B60T 8/36* (2006.01)
(Continued)

(52) U.S. Cl.
CPC .............. *G01R 31/007* (2013.01); *B60T 8/36* (2013.01); *B60T 8/885* (2013.01); *B60T 17/22* (2013.01);
(Continued)

(58) Field of Classification Search
CPC ..... B60T 1/00; B60T 7/00; F16K 1/00; F16K 15/00
See application file for complete search history.

(56) References Cited

U.S. PATENT DOCUMENTS 5,342,117 A * 8/1994 Price ....................... B60T 13/66
188/112 A
5,458,150 A * 10/1995 Tamaoki ............... B60T 8/3675
137/596.17
(Continued)

FOREIGN PATENT DOCUMENTS

CN 1836945 A1 9/2006
CN 101909955 A1 12/2010
(Continued)

OTHER PUBLICATIONS

International Search Report for PCT/EP2013/065356, dated Jul. 19, 2013.
(Continued)

*Primary Examiner* — Jermele M Hollington
*Assistant Examiner* — Temilade Rhodes-Vivour
(74) *Attorney, Agent, or Firm* — Hunton Andrews Kurth LLP

(57) ABSTRACT

A circuit arrangement for detecting a solenoid valve type in vehicles, including at least one solenoid valve in the circuit arrangement for detecting the solenoid valve type and having at least one coil winding having a resistance of the typical order of magnitude for a predetermined vehicle electrical distribution system supply voltage, a constant current source, arranged to impress a predetermined measurement current into the one coil winding of the solenoid valve, a current mirror circuit, arranged to generate a second voltage on a detection section of the circuit arrangement from a first voltage produced as a result of the impressed measurement current on the at least one coil winding of the
(Continued)

at least one solenoid valve, in which the second voltage produced on the detection section is passed out, on the detection section, directly to a microcontroller in a control device for determining the type of solenoid valve.

13 Claims, 1 Drawing Sheet

(51) Int. Cl.
B60T 17/22 (2006.01)
B60T 8/88 (2006.01)
G01R 31/04 (2006.01)
B60T 7/00 (2006.01)
G05D 1/00 (2006.01)
B60T 1/00 (2006.01)
F16K 1/00 (2006.01)
F16K 15/00 (2006.01)

(52) U.S. Cl.
CPC ............. *G01R 31/041* (2013.01); *B60T 1/00* (2013.01); *B60T 7/00* (2013.01); *B60T 2270/406* (2013.01); *F16K 1/00* (2013.01); *F16K 15/00* (2013.01); *G05D 1/00* (2013.01); *G05D 2201/00* (2013.01)

(56) References Cited

U.S. PATENT DOCUMENTS

| | | | |
|---|---|---|---|
| 6,322,166 | B1 | 11/2001 | Furuya et al. |
| 8,055,460 | B2 | 11/2011 | Ragajopalan et al. |
| 2001/0023214 | A1 | 9/2001 | Yuasa et al. |
| 2004/0041114 | A1 | 3/2004 | Hirata et al. |
| 2005/0071098 | A1 | 3/2005 | Iannone et al. |
| 2005/0140425 | A1 | 6/2005 | Adams et al. |
| 2005/0211938 | A1* | 9/2005 | Ryuen ................ F16K 11/0716 251/129.15 |
| 2005/0218362 | A1* | 10/2005 | Furuta ................ F16K 11/0716 251/129.15 |
| 2006/0214505 | A1 | 9/2006 | Yamaguchi et al. |
| 2009/0026985 | A1* | 1/2009 | Beyse ..................... B60T 8/36 318/135 |
| 2009/0126692 | A1 | 5/2009 | Boltz |

FOREIGN PATENT DOCUMENTS

| | | |
|---|---|---|
| DE | 10 2007 023189 | 11/2008 |
| DE | 10 2009 016445 | 10/2010 |
| GB | 2 200 505 | 8/1988 |
| JP | 2005-280536 A | 10/2005 |
| JP | 11-38068 A1 | 9/2012 |

OTHER PUBLICATIONS

European Patent Office, International Preliminary Report on Patentability, dated Jan. 27, 2015, from International Patent Application No. PCT/EP2013/065356 filed on Jul. 19, 2013.

English Translation of European Patent Office, International Preliminary Report on Patentability, dated Jan. 27, 2015, from International Patent Application No. PCT/EP2013/065356 filed on Jul. 19, 2013.

Office Action issued in Indian Patent Application No. 3077/KOLNP/2014, dated Jul. 18, 2018 (6 pages total).

\* cited by examiner

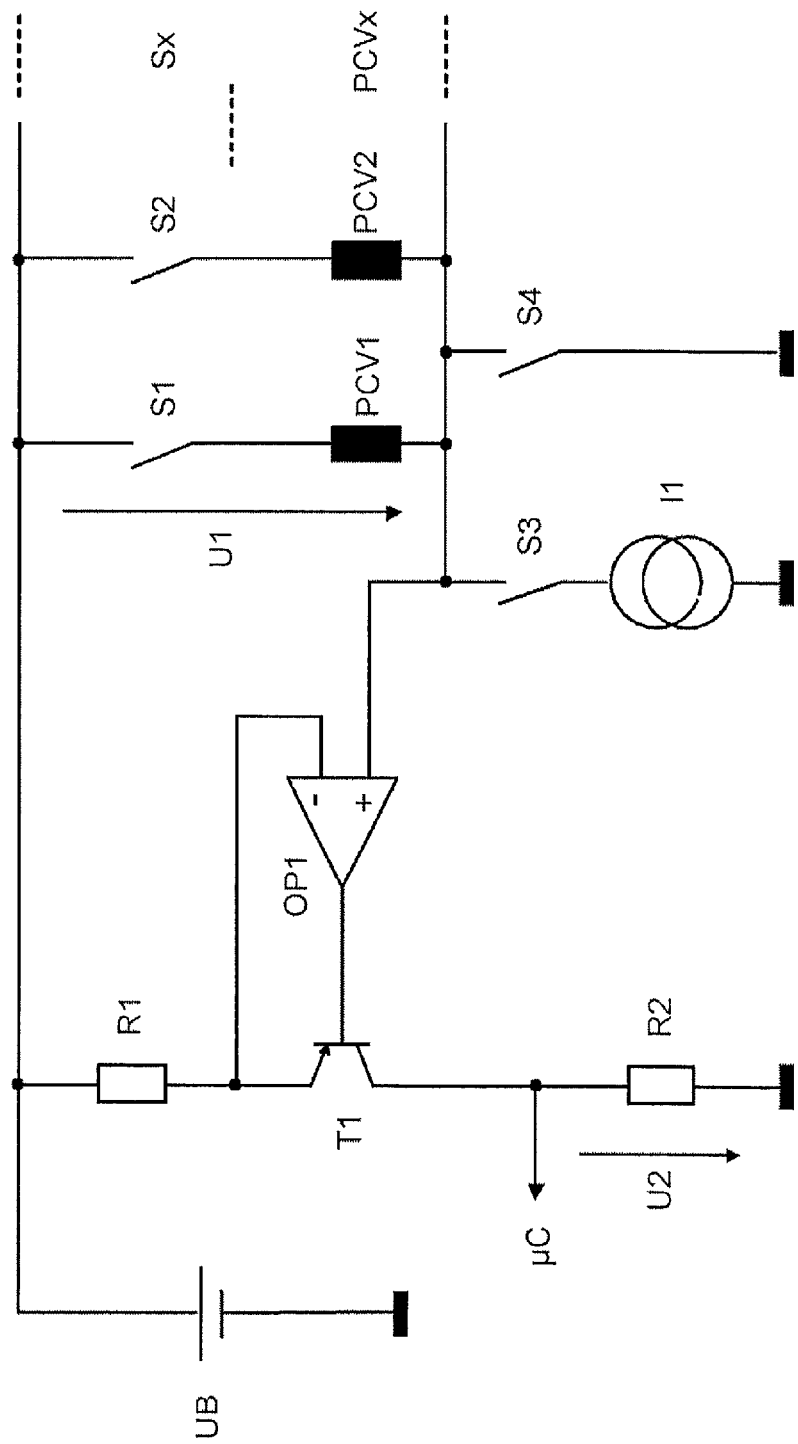

CIRCUIT ARRANGEMENT FOR DETECTING A TYPE FOR A SOLENOID VALVE

CROSS-REFERENCE TO RELATE APPLICATIONS

The present application is a continuation of U.S. patent application Ser. No. 14/417,014, filed on Jan. 23, 2015, which is the national stage of PCT International Patent Application No. PCT/EP2013/065356, filed Jul. 19, 2013, and which claims priority to Application No. 10 2012 014 800.3, filed in the Federal Republic of Germany on Jul. 26, 2012, each of which is expressly incorporated herein in its entirety by reference thereto.

FIELD OF THE INVENTION

The present invention relates to a circuit arrangement for detecting a type of solenoid valve and relates in particular to a circuit arrangement for detecting the type of solenoid valves installed in a vehicle in respect of whether the configuration of said solenoid valves is suitable for an existing vehicle electrical distribution system voltage range.

BACKGROUND INFORMATION

In automotive engineering, in particular in the case of utility vehicles, vehicle electrical distribution systems having two different vehicle electrical distribution system voltages are conventional. Primarily, these are vehicle electrical distribution systems with a rated voltage of 12 V and vehicle electrical distribution systems with a rated voltage of 24 V. For both of these voltage ranges, normally solenoid valves are used whose coils differ from one another in terms of their resistance.

For manufacturers of utility vehicles which produce vehicles with both vehicle electrical distribution system variants, it may arise that solenoid valves for 12 V are incorrectly installed in vehicles with a vehicle electrical distribution system of 24 V or solenoid valves for 24 V are incorrectly installed in vehicles with a vehicle electrical distribution system of 12 V.

Previous anti-lock braking system or ABS control devices for utility vehicles in the vicinity of which solenoid valves under consideration in particular here are used have not been able to identify such faults, with the result that, in the case of solenoid valves for 24 V in a 12 V vehicle electrical distribution system, it may firstly arise that necessary valve activations do not take place and, secondly, in a case of solenoid valves for 12 V in a 24 V vehicle electrical distribution system, overload of the solenoid valves owing to excessively high currents can occur, which results in failure of said solenoid valves.

The fundamental reason for this consists in that previous configurations of ABS systems monitor end states of solenoid valves only for short circuits to ground, short circuits to the vehicle electrical distribution system supply voltage or battery voltage and/or for load interruptions. Identification of a fault in this case generally takes place by evaluation of voltage feedback. High-resistance loads are in this case only identified above very high resistance values, however.

Against this background, the invention is based on the object of providing a circuit arrangement for improved detection of a type of solenoid valve, with which the type of solenoid valve installed in an electrical distribution system of a vehicle can be determined in respect of corresponding voltage range of solenoid valve and vehicle electrical distribution system in the case of low resistance values to be considered.

In accordance with the invention, this object is achieved by the features described herein. Advantageous developments of the invention are the subject matter of the attached dependent claims.

The invention is based on the general concept of detecting a solenoid valve which has been incorrectly installed in a vehicle, in particular a utility vehicle, i.e. a solenoid valve whose voltage range does not match the voltage range of the electrical distribution system of the vehicle in which it is installed, via the resistance of the coils provided in each case in the solenoid valves of different voltage ranges. While coils of solenoid valves configured for 24 V, for example 24 V pressure control solenoid valves, have a resistance of typically approximately 16 ohms, for example, coils of solenoid valves configured for 12 V, for example, have a resistance of typically approximately 5 ohms. If a low measurement current is now impressed into each of the coils provided, the voltage resulting from this can be measured at the solenoid valve coil and evaluated via a microcontroller in a corresponding control device for determining the voltage rating range of the solenoid valve. The resistance of the solenoid valve coils can be calculated and determined from the measured voltage and the known impressed current.

In accordance with this general concept of the invention, the proposed circuit arrangement is advantageous insofar as the measurement circuit can be kept simple at low cost, but nevertheless provides measurement accuracy with a corresponding configuration such that it is possible to safely distinguish between at least two coil types over a specified voltage range, temperature range and tolerance range. A further advantage consists in that the configuration of the circuit arrangement is possible in such a way that even low impressed currents are sufficient for the coil type determination without any restriction to the actual level of a vehicle electrical distribution system rated voltage, with the result that the detection of the coil type is possible without electrically and/or mechanically activating the associated solenoid valve. The coil type determination can therefore take place in system-transparent fashion and as such in a manner which has no effect on remaining functions of the basic ABS system, for example, in other words without the ABS system being impaired or disrupted in any way.

The object is therefore achieved by a circuit arrangement for detecting a type of solenoid valve in vehicles, characterized by at least one solenoid valve which is incorporated into the circuit arrangement for the purpose of detecting the type of said solenoid valve and has at least one coil winding having a resistance which is of the typical order of magnitude for a predetermined vehicle electrical distribution system supply voltage; a constant current source, which is arranged so as to impress a predetermined measurement current into the at least one coil winding of the at least one solenoid valve; a current mirror circuit, which is arranged so as to generate a second voltage on a detection section of the circuit arrangement from a first voltage produced as a result of the impressed measurement current on the at least one coil winding of the at least one solenoid valve; wherein the second voltage produced on the detection section is passed out, on the detection section, directly to a microcontroller in a control device for determining the type of solenoid valve.

As a result, reliable identification of an operating voltage of a solenoid valve can be performed by a simple and inexpensive circuit configuration, which can also be integrated in an already existing control device or solenoid valve module, or can be configured as an additional module, wherein the identification only needs to be performed once during or after initialization of the remaining control electronics, and the identification in this case still remains without any functional effect on a respectively measured solenoid valve and therefore does not result in any further actuation or activation of the solenoid valve or other components in its range of action. In addition, a suitable configuration of the circuit configuration also enables a resistance measurement to ground potential, and a defective coil winding can also be determined via this resistance measurement, for example when the expected typical resistance value can no longer be determined, and also the temperature or change in temperature of the coil turn can be detected by such a resistance measurement.

The detected type of solenoid valve may be a vehicle electrical distribution system supply voltage for which the solenoid valve is configured, wherein the vehicle electrical distribution system supply voltage includes rated voltages of 12 V and/or 24 V and/or more than 24 V, and the solenoid valve is a pressure control solenoid valve for use in braking systems and/or traction control systems for a utility vehicle.

As a result, it is possible to conclude that there is a correct system state in safety-relevant parts of a utility vehicle in a quick and expedient manner by distinguishing between two possible variants and determining whether there is a faulty installation, for example after the manufacturer's production facility or else after time in a workshop, which can result in a non-response of a solenoid valve and/or in failure of a solenoid valve.

If the order of magnitude of the resistance of the coil winding of the solenoid valve for a rated voltage of 12 V is typically within a single-digit resistance range and, for a higher rated voltage distinguishable therefrom, is typically in a two-digit to three-digit resistance range, safe and nevertheless activation-less detection within the scope of the orders of magnitude of other system signals is possible.

The constant current source may include a transistor, which is connected to a respective resistance at the emitter, base and collector, with a voltage signal which is 5 V in the measurement state of the circuit arrangement being applied to the base connection of said transistor.

Further, the measurement current impressed by the constant current source into the at least one coil winding of the at least one solenoid valve may be configured such that solenoid valve type detection is reliably possible, but the flow of said measurement current does not yet result in functional activation of a respectively measured solenoid valve, and the measurement current is approximately 9 mA.

As a result, it is possible to generate and impress a suitable measurement current with a simple configuration and utilization of voltage potentials present in the entire system.

The current mirror circuit may include an operational amplifier, whose input voltage range up to its supply voltage is sufficient, a transistor and a second resistance, which forms the detection section, and the current mirror circuit transmits the first voltage to a first resistance, which is connected to the transistor towards the vehicle electrical distribution system supply voltage.

This arrangement makes it possible in a simple manner to transmit the voltage produced by the impressed measurement current at the coil of a measured solenoid valve to a circuit section on which said voltage can be received and evaluated by a microcontroller. Particular advantages result from the fact that a voltage produced at external points, for example on solenoid valves installed in wheel modules, can be converted in a suitable manner into an internal detection voltage, and this can additionally be matched to existing requirements by virtue of the configuration of the current mirror.

Advantageously, at least one first high-side switch for activating the coil of the at least one solenoid valve is provided in series with the at least one solenoid valve, a second switch, which is common for the at least one solenoid valve, is provided in parallel with the constant current source to ground potential, wherein said second switch is closed in the normal operating state, and a third switch for switchably impressing the constant current is provided at the constant current source, wherein, in a measurement operation state, the third switch is closed, the second switch is open, and the at least one first switch is closed.

This arrangement makes it possible, when a plurality of solenoid valves are provided, to implement and evaluate a separate and/or sequential measurement of individual solenoid valves by defined setting of the switching states of the individual switches by virtue of, for example, first the second and third switches being set to a state intended for the measurement and then the first switches which, in the case of a plurality of solenoid valves, are present in total as a plurality but in each case with only one on each individual solenoid valve being switched on/off or turned on successively, and therefore the impressed measurement current flowing in each case only through a or the desired coil(s) of the solenoid valves to be measured.

A sensitivity and/or a detection range of the circuit arrangement may be adjustable, wherein the resistance of the solenoid coils can be calculated via the transformation ratio U1/U2 of the first voltage to the second voltage and the impressed measurement current.

If the sensitivity and/or the detection range of the circuit arrangement is adjustable or capable of being switched over, it becomes possible to influence and possibly match the accuracy of the measurement and/or, if necessary, to measure a relatively large resistance difference between the resistance values of individual solenoid valve coils. Firstly, the circuit arrangement becomes suitable for universal use thereby, and secondly it becomes possible to replace individual solenoid valves with, for example, valves of another, for example newer, type with different coil resistance values without needing to make any changes to the remaining circuit arrangement. Since, in addition, the first voltage generated by the impressed measurement current or the value thereof converted after mirroring is detectable and the impressed measurement current itself is known, this enables a coil resistance detection without any notable loading of the system in respect of time and computation complexity.

The circuit arrangement may form part of an anti-lock braking system and/or part of a traction control system for utility vehicles.

In such safety-relevant sections of vehicles, the integration of an additional identification, in accordance with the invention, of the presence of a solenoid valve with the correct rating in respect of the vehicle electrical distribution system supply voltage is particularly advantageous because, for example, even in the case of system activation during end-of-line testing in the manufacturer's factory or once maintenance or repair work has been performed, for example, it is possible to avoid, by suitable signaling, a situation whereby a vehicle with parts which are unsuitable for operation at least initially is used on the road again. In other words, the risk of a fault owing to a) a non-response of a solenoid valve as a result of a lack of drivability and/or b) a partial system failure as a result of destruction of a solenoid valve after operation outside its specification and/or overloading becoming the responsibility of a driver of the utility vehicle is effectively reduced.

Specifically, overall the circuit arrangement according to the invention is in principle characterized by the fact that a battery is provided as vehicle electrical distribution system supply voltage, a first resistance and at least one first switch are connected at in each case one first connection to a high potential of the vehicle electrical distribution system supply voltage, a transistor is connected at an emitter connection to the first resistance, an operational amplifier is connected at an output thereof to a base connection of the transistor, an inverting input of the operational amplifier is connected to the first resistance and to the emitter connection of the transistor, a noninverting input of the operational amplifier is connected to a first connection of a second switch, a first connection of a third switch, and a second connection of the at least one solenoid valve, a first connection of the at least one solenoid valve is connected to a second connection of the at least one first switch, a collector connection of the transistor is connected to a first connection of a second resistance, a second connection of the third switch is connected to a first connection of the constant current source, and in each case a second connection of the second resistance, a second connection of the constant current source, and a second connection of the second switch are connected to a low potential of the vehicle electrical distribution system supply voltage, wherein the second voltage as measurement voltage is passed out to the microcontroller between the first connection of the second resistance and the collector connection of the transistor.

The invention will be described in more detail below using a exemplary embodiment of the circuit arrangement with reference to the drawing.

BRIEF DESCRIPTION OF THE DRAWING

The FIGURE shows a simplified illustration of a circuit arrangement for detecting the type of solenoid valve in accordance with an exemplary embodiment.

DETAILED DESCRIPTION

As shown in the FIGURE, a vehicle electrical distribution system supply voltage for a vehicle, for example a utility vehicle, is provided. The vehicle electrical distribution system supply voltage may be, for example, a battery which provides a supply or battery voltage UB of 12 V or 24 V. The vehicle electrical distribution system voltage supply is not restricted to these voltages, however. Instead, the circuit arrangement, with a corresponding configuration, is suitable for any desired vehicle electrical distribution system voltage supplies or any desired vehicle electrical distribution system rated voltages, for example even for those with supply or battery voltages of more than 24 V, such as 42 V or the like. A first connection of a first resistance R1, a first connection of a first switch S1 and a first connection of a second switch S2 are connected to the positive potential of the vehicle electrical distribution system voltage supply in the exemplary embodiment shown. The second switch S2 may be in the form of a single or double field-effect transistor.

A second connection of the first resistance R1 is connected to an emitter connection of a transistor T1. As illustrated, the transistor T1 is a PNP transistor, for example, but is not restricted thereto. The collector connection of the transistor T1 is connected to a first connection of a second resistance R2. The base connection of the transistor T1 is connected to an output of an operational amplifier OP1, with the potential at the second connection of the first resistance R1 being supplied to the inverting input connection of said operational amplifier OP1. The operational amplifier OP1 is in this case may be one which has an input voltage range which reaches up to its supply voltage.

The noninverting connection of the operational amplifier OP1 is connected to a first connection of a third switch S3. A first connection of a current source I1 is connected to a second connection of the third switch S3, said current source in turn being connected to ground potential at a second connection.

The first connection of the third switch S3 is connected to the same potential as a second connection of a first solenoid valve coil PCV1, a second connection of a second solenoid valve coil PCV2 and a first connection of a fourth switch S4. A second connection of the fourth switch S4 is connected to ground potential, and a first connection of the first solenoid valve coil PCV1 and a first connection of the second solenoid valve coil PCV2 are each connected to a second connection of the first switch S1 and a second connection of the second switch S2.

Although two series circuits comprising switches S1, S2 and solenoid valve coils PCV1, PCV2 are shown in the FIGURE, said series circuits are merely representative of any desired number of solenoid valve coils PCV1, PCV2, . . . , PCVx which are possible with corresponding interconnection with switches S1, S2, . . . , Sx, as is indicated by the continuing broken lines in the FIGURE.

In a practical configuration and/or modification of the circuit arrangement illustrated in simplified form in the FIGURE, the fourth switch S4 is a switch to ground potential which is common to all of the solenoid valve coils and is closed in a normal operating state. In addition, the first switch S1 and the second switch S2 are embodied as so-called high-side switches and may be embodied as high-side transistor switches or high-side field-effect transistors, which as such are connected to the positive supply potential and are not referred to ground potential, but switch to the positive supply potential. The first switch S1 and the second switch S2 are arranged so as to activate the solenoid valve coils PCV1 and PCV2 during intervention for regulation.

Since, as described above, high-side switches are used for activating the individual solenoid valve coils PCV1, PCV2, . . . , PCVx, the voltage to be detected for determining the resistance of the solenoid valve coils PCV1, PCV2, . . . , PCVx needs to be measured against the vehicle electrical distribution system supply voltage UB and transmitted in a suitable manner to the microcontroller (not shown), which is at ground potential. It should be noted that the measurement can of course also be performed accordingly with respect to ground potential.

The current source I1 forms a constant current source and is arranged so as to impress the measurement current into the solenoid valve coils PCV1, PCV2, . . . , PCVx via closing of the third switch S3 (and of the first switch S1 or the second switch S2). For this purpose, in accordance with the exemplary embodiment, current source switching for impressing a constant current as measurement current is used (in other words the measurement is performed by impressing a constant current) in such a way that the measured voltage U1 at the respective solenoid valve coil PCV1, PCV2, . . . , PCVx is independent of the level of the battery or vehicle electrical distribution system supply voltage. Specifically, the current source I1 can include a transistor, for example an NPN transistor or FET, which is connected at the base, emitter and collector in each case to a suitable resistance, with a voltage of 5 V present at the base connection of the transistor in the measurement state.

The current source I1 may be configured such that, in the exemplary embodiment under consideration here, in order to distinguish between solenoid valve coils for vehicle electrical distribution system rated voltages of 12 V or 24 V and typical coil resistances of 5 ohms, i.e. a value in a single-digit resistance range, or approximately 16 ohms, i.e. a value in a two-digit resistance range, it generates a constant measurement current of approximately 9 Ma given these two vehicle electrical distribution system supply voltages, which constant measurement current is sufficient in magnitude to safely distinguish the type of solenoid valve coil measured (its rated voltage) but still does not result in activation of the solenoid valve coil.

It goes without saying that, for other vehicle electrical distribution system rated voltages or for solenoid valves with a different configuration or another intended use, for example pressure control solenoid valves for traction control systems or TCS, which at present can have, for example, a coil resistance of the order of magnitude of between 8 ohms, i.e. a value in a single-digit resistance range, and 128 ohms, i.e. a value in a three-digit resistance range, the circuit arrangement can be configured for identification of and distinguishing between such solenoid valves overall as well and therefore also for correspondingly other resistance values to be measured and/or constant measurement currents. The operational amplifier OP1, the transistor T1 and the second resistance R2 form a current mirror circuit, which mirrors or transmits the voltage U1 that can be measured at the parallel series circuits of switches S1, S2, ..., Sx and solenoid valve coils PCV1, PCV2, ..., PCVx initially onto the first resistance R1 and then as voltage U2 onto the second resistance R2. As illustrated schematically in the FIGURE by an arrow denoted by µC, the voltage U2 is passed out directly to the microcontroller between the first connection of the second resistance R2 and the collector connection of the transistor T1.

The measurement of the resistances of the solenoid valve coils PCV1, PCV2, ..., PCVx advantageously only needs to be performed once, for example during or after a switch-on operation of the control device.

In order to perform such a resistance measurement of the solenoid valve coils PCV1, PCV2, ..., PCVx for detection of the (voltage) type thereof, the second switch S2 is opened, the third switch S3 is closed and all of the switches S1, S2, ..., Sx assigned in each case to the individual solenoid valve coils PCV1, PCV2, ..., PCVx are closed successively. The resistance of the individual solenoid valve coils PCV1, PCV2, ..., PCVx can be determined or calculated via the voltage transformation ratio U1/U2 known within the circuit arrangement and the likewise known impressed measurement current from the current source I1 if the saturation voltage as a voltage drop across the switches S1, S2, ..., Sx is sufficiently low or else is known.

In addition, provision may be made for the circuit arrangement to be configured so as to be adjustable or capable of being switched over in respect of sensitivity and/or detection range in such a way that more precise measurement is possible and/or larger and/or extended resistance ranges are measurable. Such a capacity for adjustment or switchover can be achieved, for example, by virtue of the fact that the constant current generated by the constant current source I1 is configured so as to be controllably variable in terms of its absolute magnitude, at least one element of the current mirror circuit is configured so as to be controllably variable, and/or the second resistance R2 is configured so as to be variably controllable, for example in accordance with a type of resistance matrix comprising a plurality of resistances which are parallel to one another and are individually switchable via resistive switches in their feed lines. Depending on a point of action of the adjustability or capacity for switchover, in this case a change can be controlled via the microcontroller by software, for example, or can be initiated correspondingly by permanently wired adjustment points. In general, there is no restriction to a specific configuration embodiment of the adjustability or capacity for switchover as long as, by a specific embodiment, the voltage transformation ratio U1/U2 known within the circuit arrangement and/or the likewise known impressed measurement current from the current source I1 are influenced in a suitable manner for determining or calculating the resistance of the individual solenoid valve coils PCV1, PCV2, ..., PCVx so as to improve the measurement accuracy or extend the measurement range.

It is noted that additionally also a defect in a coil winding, such as a turn-to-turn fault, for example, can be detected via the measurement of the resistance of the solenoid valve coils PCV1, PCV2, ..., PCVx (i.e. the resistance measurement) described herein. Conclusions in this regard can be drawn, for example, in the evaluating microcontroller when, for example, a typical resistance value to be expected is no longer present or determinable. In addition, in principle a temperature and/or a change in temperature of a winding of a solenoid valve coil is/are also detectable by such a resistance measurement.

It goes without saying that the above-described exemplary embodiment is not restricted to the elements specified by way of example and specific circuitry forms, but rather that individual or else a plurality of elements can be represented by functionally identical elements, circuits of a plurality of elements, embodiments, in particular also in the case of polarity reversal and/or the use of other types of line and/or embodiments of respectively used electronic switch types. It likewise goes without saying that the resistance detection described herein for solenoid valve coils is not restricted to solenoid valves in an ABS system or a TCS, but can be implemented in the case of a multiplicity of other arrangements and systems, even those which are not only in vehicles or utility vehicles, which meet the basic requirements for such a resistance measurement and enable direct measurement of (impressed) valve currents in solenoid valve coils.

Such modifications, which are comparable or equivalent to the above detailed description of an exemplary embodiment, and likewise further circuit elements which can form further circuitry for suitable functional matching, adjustment and/or configuration, are not essential to the functional principle of the circuit arrangement according to the invention, however, and the specific selection of such modifications will readily be inferred by a person skilled in the art and should therefore not be considered as departing from the subject matter of the invention or leaving the scope of protection of the invention in accordance with the attached patent claims.

What is claimed is:

1. A circuit arrangement for detecting a type of solenoid valve in a vehicle, comprising:
   at least one solenoid valve incorporated into the circuit arrangement to detect the type of the solenoid valve and having at least one coil winding having a resistance associated with a predetermined vehicle electrical distribution system supply voltage;

a current source arranged so as to impress a predetermined measurement current into the at least one coil winding of the at least one solenoid valve; and a microcontroller in a control device for determining the type of solenoid valve based on the impressed measurement current by the current source.

2. The circuit arrangement of claim 1, wherein a first voltage is produced as a result of the impressed measurement current on the at least one coil winding of the at least one solenoid valve.

3. The circuit arrangement of claim 1, wherein the circuit arrangement forms part of an anti-lock braking system and/or part of a traction control system for a utility vehicle.

4. A circuit arrangement for detecting a type of solenoid valve in a vehicle comprising:
at least one solenoid valve incorporated into the circuit arrangement to detect the type of the solenoid valve and having at least one coil winding having a resistance associated with a predetermined vehicle electrical distribution system supply voltage;
a current source arranged so as to impress a predetermined measurement current into the at least one coil winding of the at least one solenoid valve; and
a microcontroller in a control device for determining the type of solenoid valve based on the impressed current source;
wherein a first voltage is produced as a result of the impressed measurement current on the at least one coil winding of the at least one solenoid valve; and
wherein the circuit arrangement further comprises a current mirror circuit arranged so as to generate a second voltage from the first voltage, wherein the second voltage is transmitted to the microcontroller.

5. The circuit arrangement of claim 4, wherein the current mirror circuit includes an operational amplifier, a transistor and a second resistance, and the current mirror circuit transmits the first voltage to a first resistance, which is connected to the transistor towards the vehicle electrical distribution system supply voltage.

6. The circuit arrangement of claim 4, wherein a sensitivity and/or a detection range of the circuit arrangement is adjustable, wherein the resistance of the solenoid coils is calculated via the transformation ratio of the first voltage to the second voltage and the impressed measurement current.

7. A circuit arrangement for detecting a type of solenoid valve in a vehicle comprising:
at least one solenoid valve incorporated into the circuit arrangement to detect the type of the solenoid valve and having at least one coil winding having a resistance associated with a predetermined vehicle electrical distribution system supply voltage;
a current source arranged so as to impress a predetermined measurement current into the at least one coil winding of the at least one solenoid valve; and
a microcontroller in a control device for determining the type of solenoid valve based on the impressed current source;
wherein the detected type of solenoid valve is a vehicle electrical distribution system supply voltage for which the solenoid valve is designed, wherein the vehicle electrical distribution system supply voltage includes rated voltages of 12 V and/or 24 V, and in that the solenoid valve is a pressure control solenoid valve for use in braking systems and/or traction control systems of a utility vehicle.

8. The circuit arrangement of claim 7, wherein the resistance of the coil winding of the solenoid valve for a rated voltage of 12 V is within a single-digit resistance value range, and for a higher rated voltage, is within a two-digit to three-digit resistance value range.

9. A circuit arrangement for detecting a type of solenoid valve in a vehicle comprising:
at least one solenoid valve incorporated into the circuit arrangement to detect the type of the solenoid valve and having at least one coil winding having a resistance associated with a predetermined vehicle electrical distribution system supply voltage;
a current source arranged so as to impress a predetermined measurement current into the at least one coil winding of the at least one solenoid valve; and
a microcontroller in a control device for determining the type of solenoid valve based on the impressed current source;
wherein the current source includes a transistor, which is connected to a respective resistance at the emitter, base and collector, with a voltage signal which is 5 V in the measurement state of the circuit arrangement being applied to the base connection of said transistor.

10. A circuit arrangement for detecting a type of solenoid valve in a vehicle comprising:
at least one solenoid valve incorporated into the circuit arrangement to detect the type of the solenoid valve and having at least one coil winding having a resistance associated with a predetermined vehicle electrical distribution system supply voltage;
a current source arranged so as to impress a predetermined measurement current into the at least one coil winding of the at least one solenoid valve; and
a microcontroller in a control device for determining the type of solenoid valve based on the impressed current source;
wherein the measurement current impressed by the current source into the at least one coil winding of the at least one solenoid valve is configured so that solenoid valve type is detectable, but the flow of said measurement current does not yet result in functional activation of a respectively measured solenoid valve, and the measurement current is approximately 9 mA.

11. A circuit arrangement for detecting a type of solenoid valve in a vehicle comprising:
at least one solenoid valve incorporated into the circuit arrangement to detect the type of the solenoid valve and having at least one coil winding having a resistance associated with a predetermined vehicle electrical distribution system supply voltage;
a current source arranged so as to impress a predetermined measurement current into the at least one coil winding of the at least one solenoid valve; and
a microcontroller in a control device for determining the type of solenoid valve based on the impressed current source;
wherein at least one first high-side switch for activating the coil of the at least one solenoid valve is in series with the at least one solenoid valve, a second switch, which is common for the at least one solenoid valve, is in parallel with the current source to ground potential, wherein said second switch is closed in the normal operating state, and a third switch for switchably impressing the current is at the current source, and wherein, in a measurement operation state, the third switch is closed, the second switch is open, and the at least one first switch is closed.

12. A circuit arrangement for detecting a type of solenoid valve in a vehicle comprising:
- at least one solenoid valve incorporated into the circuit arrangement to detect the type of the solenoid valve and having at least one coil winding having a resistance associated with a predetermined vehicle electrical distribution system supply voltage;
- a current source arranged so as to impress a predetermined measurement current into the at least one coil winding of the at least one solenoid valve; and
- a microcontroller in a control device for determining the type of solenoid valve based on the impressed current source;
- wherein a battery is provided as a vehicle electrical distribution system supply voltage, a first resistance and at least one first switch are connected at in each case one first connection to a high potential of the vehicle electrical distribution system supply voltage, a transistor is connected at an emitter connection to the first resistance, an operational amplifier is connected at an output thereof to a base connection of the transistor, an inverting input of the operational amplifier is connected to the first resistance and to the emitter connection of the transistor, a noninverting input of the operational amplifier is connected to a first connection of a second switch, a first connection of a third switch, and a second connection of the at least one solenoid valve, a first connection of the at least one solenoid valve is connected to a second connection of the at least one first switch, a collector connection of the transistor is connected to a first connection of a second resistance, a second connection of the third switch is connected to a first connection of the current source, and in each case a second connection of the second resistance, a second connection of the current source, and a second connection of the second switch are connected to a low potential of the vehicle electrical distribution system supply voltage, wherein the second voltage as measurement voltage is passed out to the microcontroller between the first connection of the second resistance and the collector connection of the transistor.

13. A circuit arrangement for detecting a type of solenoid valve in a vehicle comprising:
- at least one solenoid valve incorporated into the circuit arrangement to detect the type of the solenoid valve and having at least one coil winding having a resistance associated with a predetermined vehicle electrical distribution system supply voltage;
- a current source arranged so as to impress a predetermined measurement current into the at least one coil winding of the at least one solenoid valve; and
- a microcontroller in a control device for determining the type of solenoid valve based on the impressed current source;
- wherein the detected type of solenoid valve is a vehicle electrical distribution system supply voltage for which the solenoid valve is designed, wherein the vehicle electrical distribution system supply voltage includes rated voltages of more than 24 V, and in that the solenoid valve is a pressure control solenoid valve for use in braking systems and/or traction control systems of a utility vehicle.

* * * * *